United States Patent
Kim et al.

(10) Patent No.: US 8,443,265 B2
(45) Date of Patent: May 14, 2013

(54) METHOD AND APPARATUS FOR MAP DECODING AND TURBO DECODER USING THE SAME

(75) Inventors: Nam Il Kim, Daejeon (KR); Dae Ho Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 937 days.

(21) Appl. No.: 12/544,584

(22) Filed: Aug. 20, 2009

(65) Prior Publication Data

US 2010/0162077 A1 Jun. 24, 2010

(30) Foreign Application Priority Data

Dec. 19, 2008 (KR) .................. 10-2008-0130212

(51) Int. Cl.
*H03M 13/35* (2006.01)
*H03M 13/45* (2006.01)

(52) U.S. Cl.
USPC .......................................... 714/774; 714/780

(58) Field of Classification Search .................. 714/755, 714/774, 780
See application file for complete search history.

(56) References Cited

U.S. PATENT DOCUMENTS

| | | | |
|---|---|---|---|
| 6,966,024 B2 * | 11/2005 | Park | 714/780 |
| 7,003,709 B2 * | 2/2006 | Wengerter et al. | 714/748 |
| 7,860,194 B2 * | 12/2010 | Kim et al. | 375/341 |
| 8,050,362 B2 * | 11/2011 | Gho et al. | 375/340 |
| 8,223,868 B2 * | 7/2012 | Lee | 375/262 |
| 8,270,541 B2 * | 9/2012 | Fischer et al. | 375/341 |
| 2002/0126763 A1 | 9/2002 | Jeong et al. | |
| 2005/0097430 A1 | 5/2005 | Park | |
| 2007/0127605 A1 | 6/2007 | Sindhushayana | |

FOREIGN PATENT DOCUMENTS

| | | |
|---|---|---|
| KR | 2002-0021351 | 3/2002 |
| KR | 10-2005-0042869 | 5/2005 |
| KR | 1020050111842 | 11/2005 |
| KR | 1020060084218 | 7/2006 |

* cited by examiner

*Primary Examiner* — Stephen M Baker

(74) *Attorney, Agent, or Firm* — Nelson Mullins Riley & Scarborough LLP; EuiHoon Lee, Esq.

(57) ABSTRACT

A Maximum A Posteriori (MAP) decoder and a MAP decoding method are provided. The MAP decoder includes a first metric operation unit, a first bit-width control unit, a second metric operation unit, a Log Likelihood Ratio (LLR) operation unit, and a second bit-width control unit. The first metric operation unit outputs a first metric data using an input data. The first bit-width control unit controls a bit-width of the first metric data according to a modulation scheme of the input data. The second metric operation unit outputs a second metric data using the first metric data having the controlled bit-width. The LLR operation unit outputs LLR data using the second metric data. The second bit-width control unit outputs decoding data by re-controlling the bit-width of the LLR data.

20 Claims, 5 Drawing Sheets

METHOD AND APPARATUS FOR MAP DECODING AND TURBO DECODER USING THE SAME

CROSS-REFERENCE TO RELATED APPLICATIONS

This application claims priority under 35 U.S.C. §119 to Korean Patent Application No. 10-2008-0130212, filed on Dec. 19, 2008, in the Korean Intellectual Property Office, the disclosure of which is incorporated herein by reference in its entirety.

TECHNICAL FIELD

The present disclosure relates to a technology of decoding turbo-encoded data, and in particular, to a method for decoding turbo-encoded data by controlling a bit-width of data in the decoding process.

BACKGROUND

A signal transmitted through a wireless channel is distorted by the wireless channel. Accordingly, modulation/demodulation and encoding/decoding processes of data are performed to restore data from the distorted signal.

Examples of representative modulation/demodulation schemes used in current mobile communication systems include Mary-QAM (where M is 4, 16, 64, and 256), and examples of representative encoding schemes include an encoding scheme using a turbo code.

After turbo-encoded and Mary-QAM modulated signal is received to be Mary-QAM demodulated, the signal is decoded by a turbo decoder implemented in hardware such as FPGA or ASIC for decoding the demodulated signal.

Log Likelihood Ratio (LLR) data inputted from a demodulator is selected in consideration of hardware complexity and processing time of a turbo decoder. LLR data inputted from a related-art demodulator to a turbo decoder has a bit-width of 6 to 9 bits.

Bit-width of demodulated LLR signal has a significant effect on the complexity and the processing time upon implementation of turbo decoder hardware.

If the bit-width of inputted LLR data of a turbo decoder is small, data error rates increase. If the bit-width of the inputted LLR data is too big, hardware complexity and necessity for a higher processing speed increase.

When the bit-width of LLR data inputted from a demodulator according a modulation scheme applied for data transmission is maintained constant, performance might be deteriorated depending on a modulation scheme of a signal.

The present disclosure provides a method for restoring data without performance deterioration and increased complexity of a turbo decoder by varying a bit-width of operation data according to a modulation scheme, in regard to a decoding operation of LLR data inputted from a demodulator to a turbo decoder.

SUMMARY

In one general aspect, a Maximum A Posteriori (MAP) decoder includes: a first metric operation unit outputting a first metric data using an input data; a first bit-width control unit controlling a bit-width of the first metric data according to a modulation scheme of the input data; a second metric operation unit outputting a second metric data using the first metric data having the controlled bit-width; a Log Likelihood Ratio (LLR) operation unit outputting LLR data using the second metric data; and a second bit-width control unit outputting decoding data by re-controlling the bit-width of the LLR data.

The LLR operation unit may output the LLR data using the second metric data and the first metric data having the controlled bit-width.

The first bit-width control unit may include: a first scaling unit scaling the bit-width of the first metric data by S1 according to the modulation scheme of the input data; and a first clipping unit clipping the scaled data at the first scaling unit, and the second bit-width control unit may include: a second scaling unit scaling the bit-width of the LLR data by S2 according to the modulation scheme of the input data; and a second clipping unit clipping the scaled data at the second scaling unit.

The S1 and the S2 may satisfy a relation of S2=1/S2.

The MAP decoder may further include a third clipping unit clipping the second metric data to deliver to the LLR operation unit.

In another general aspect, a MAP decoding method includes: outputting a first metric data using an input data; controlling a bit-width of the first metric data according to a modulation scheme of the input data; outputting a second metric data using the first metric data having the controlled bit-width; outputting LLR data using the second metric data; and controlling a bit-width of the LLR data.

The outputting of LLR data may include outputting the LLR data using the second metric data and the first metric data having the controlled bit-width.

The controlling of a bit-width of the first metric data may include: scaling the bit-width of the first metric data by S1 according to the modulation scheme of the input data; and clipping the scaled first metric data, and the controlling of a bit-width of the LLR data may include: scaling the bit-width of the LLR data by S2 according to the modulation scheme of the input data; and clipping the scaled LLR data.

The S1 and the S2 may satisfy a relation of S2=1/S2.

After the outputting of a second metric data, the MAP decoding method may further include clipping the second metric data to deliver to the LLR operation unit.

In another general aspect, a turbo decoder includes: a first MAP decoder outputting a first LLR using a deinterleaved LLR and a first input data from a demodulator; an interleaver interleaving data acquired by subtracting the deinterleaved LLR from the first LLR; a second MAP decoder outputting a second LLR using a second input data received from the demodulator and the interleaved data; and a first deinterleaver deinterleaving data acquired by subtracting the data outputted from the interleaver from the second LLR to transmit to the first MAP decoder, wherein each of the first and the second MAP decoders include: a first metric operation unit outputting a first metric data using an input data; a first bit-width control unit controlling a bit-width of the first metric data according to a modulation scheme of the input data; a second metric operation unit outputting a second metric data using the first metric data having the controlled bit-width; an LLR operation unit outputting LLR data using the second metric data; and a second bit-width control unit outputting decoding data by re-controlling the bit-width of the LLR data.

The LLR operation unit may output the LLR data using the second metric data and the first metric data having the controlled bit-width.

The first or the second MAP decoder may further include a third clipping unit clipping the second metric data to deliver to the LLR operation unit.

Other features and aspects will be apparent from the following detailed description, the drawings, and the claims.

DETAILED DESCRIPTION OF EMBODIMENTS

Figure 1:
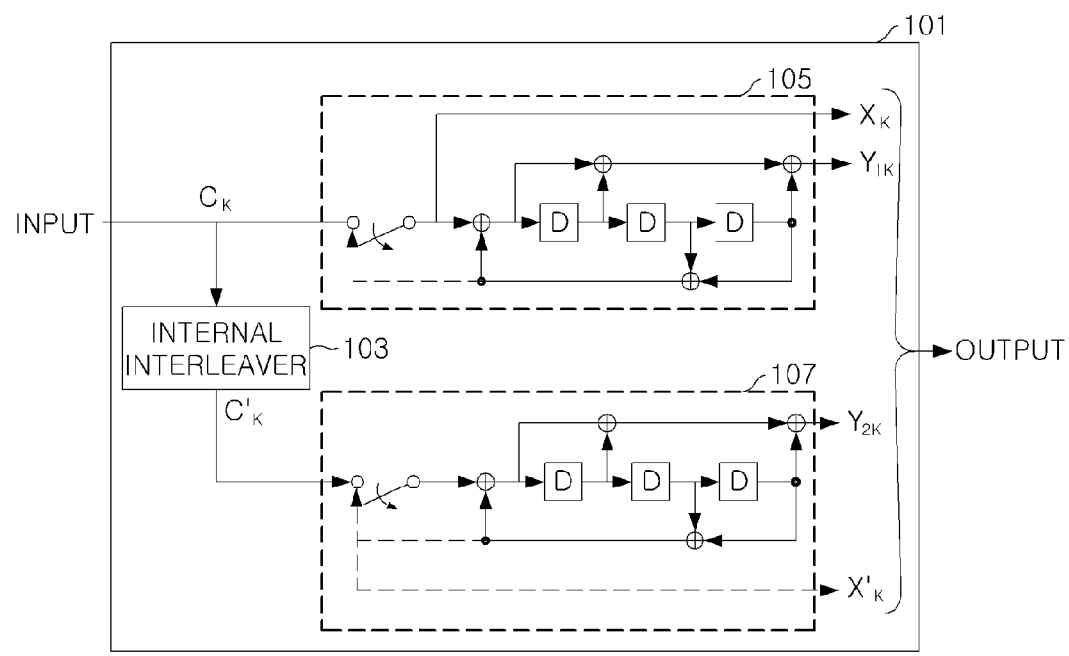
FIG. 1 is a block diagram illustrating an exemplary configuration of a turbo encoder.

Hereinafter, exemplary embodiments will be described in detail with reference to the accompanying drawings. Throughout the drawings and the detailed description, unless otherwise described, the same drawing reference numerals will be understood to refer to the same elements, features, and structures. The relative size and depiction of these elements may be exaggerated for clarity, illustration, and convenience. The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

If turbo-encoded and Mary-QAM (where M is 4, 16, 64, and 256) modulated signal is transmitted, the signal received through a noisy channel is restored in a receiving unit of a communication system by turbo-decoding LLR data outputted from a Mary-QAM demodulator.

A turbo-decoding method of the present invention minimizes performance deterioration caused by hardware implementation, without increasing complexity of hardware by varying a bit-width of data operation bit of a turbo decoder according to a modulation scheme of a signal.

More specifically, a turbo decoder according to an embodiment of the present invention performs scaling and clipping of data outputted from a branch metric operation unit using LLR data that is inputted into the turbo decoder according to a modulation scheme, and performs scaling and clipping of LLR value calculated from state metrics (Forward State Metric (FSM) and Backward State Metric (BSM)). Then, data acquired by the above process is used as an output of a Maximum A Posteriori (MAP) decoder.

Through the data scaling of the above Branch Metric (BM) data and LLR data, decoding performance is improved without increasing hardware complexity in a process of decoding data modulated and transmitted by various modulation schemes.

FIG. 1 is a block diagram illustrating an exemplary configuration of a turbo encoder.

The turbo encoder 101 includes an internal interleaver 103 for encoding an input information data sequence $C_k$ having a length of K-bit, and two identical Recursive Systematic Convolutional (RSC) encoders 105 and 107.

The input information data sequence $C_k$ having a length of K-bit, which is inputted into the turbo encoder 101, and interleaved data $C_k'$ having a length of K-bit, which is acquired by interleaving the input information data sequence $C_k$ through the internal interleaver 103 are encoded by the two RSC encoders 105 and 107 connected in parallel.

The interleaver 103 lowers the correlation degree between the data inputted into the two RSC encoders 105 and 107, by changing the sequence of data bits inputted into the second RSC encoder 107. Accordingly, encoded data bits outputted from the two RSC encoders 105 and 107 have low weight codewords at the same time.

After the two RSC encoders 105 and 107 encode data bit of K-bit, the two RSC encoders 105 and 107 output tail bits having a length corresponding to the number of shift registers D according to a constraint length.

Accordingly, output data of the turbo encoder 101 includes systematic bits $X_k$ including the tail bits, two parity bits $Y_{1k}$ and $Y_{2k}$, and a tail bit $X'_k$ of interleaved regular bits.

Figure 2:
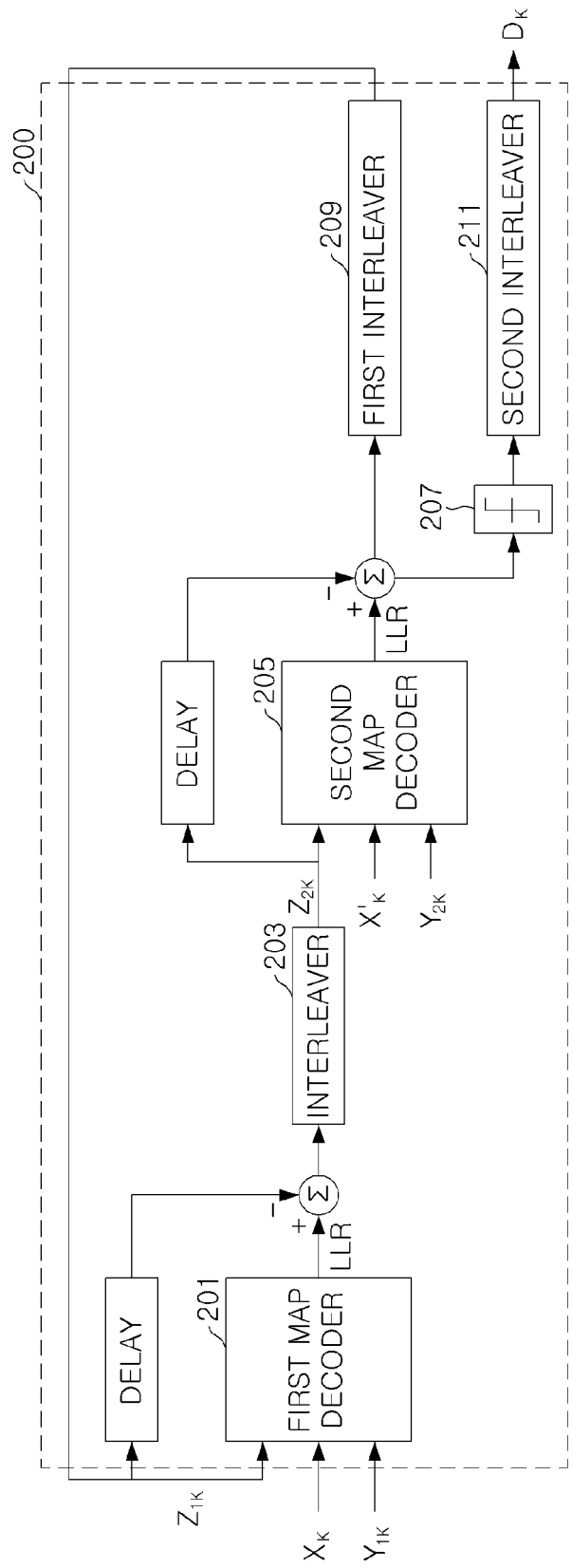
FIG. 2 is a block diagram illustrating an exemplary configuration of a turbo decoder.

FIG. 2 is a block diagram illustrating an exemplary configuration of a turbo decoder.

Referring to FIG. 2, a turbo decoder 200 includes a first MAP decoder 201, a second MAP decoder 205, an interleaver 203, a first deinterleaver 209, a second deinterleaver 211, and a memory (not shown). The two MAP decoders 201 and 205 have the same structure.

The first MAP decoder 201 receives systematic data $X_k$ and non-systematic data $Y_{1k}$ from a demodulator, and data $Z_{1k}$ outputted from the first deinterleaver 209, and outputs an LLR.

The LLR outputted from the first MAP decoder 201 is inputted into the second MAP decoder 205 after the data $Z_{1k}$ outputted from the first deinterleaver 209 is subtracted from the LLR.

The second MAP decoder 205 receives interleaved data $Z_{2k}$, tail bit data $X'_k$ of interleaved non-systematic data of a transmission terminal, and non-systematic data $Y_{2k}$, and outputs an LLR.

The LLR outputted from the second MAP decoder 205 is deinterleaved in the first deinterleaver 209 after the interleaved data $Z_{2k}$ is subtracted from the LLR outputted from the second MAP decoder 205.

The turbo decoder 200 repeatedly performs the decoding process. If a predetermined number of cycles are finished, a hard decision of the LLR outputted from the second MAP decoder 205 is performed by a hard decision unit 207. Then the LLR is outputted as an output data $D_k$ of the turbo decoder 200 through the second deinterleaver 211.

Figure 3:
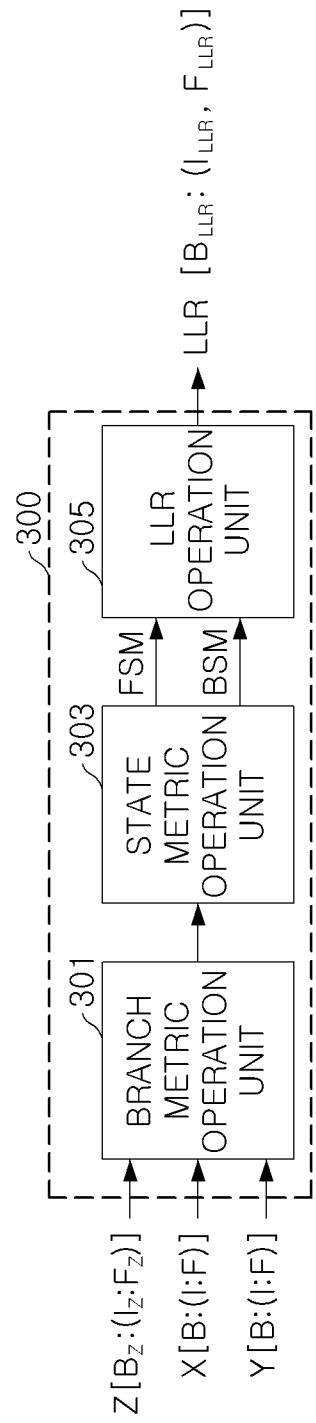
FIG. 3 is a block diagram illustrating an exemplary configuration of a related-art MAP decoder.

FIG. 3 is a block diagram illustrating an exemplary configuration of a related-art MAP decoder.

A MAP decoder 300 includes a BM operation unit 301, a state metric operation unit 303, and an LLR operation unit 305. The BM operation unit 301 receives data Z outputted from an interleaver or a deinterleaver, LLR systematic data X outputted from a demodulator, and LLR non-systematic parity data Y. Then, the BM operation unit 301 outputs a branch metric (BM).

The SM operation unit 303 outputs a forward state metric (FSM) and a backward state metric (BSM) using the BM. The LLR operation unit 305 outputs an LLR using the FSM and the BSM.

A bit-width of LLR inputted from a demodulator is generally determined to be fixed upon hardware implementation.

If the total bit-width of LLR outputted from the demodulator is B, a bit-width of integer part including a dual code bit is I-bit, and a bit-width of fractional part is F-bit, then this is expressed as [B:(I, F)].

If the total bit-width of data Z inputted into the MAP decoder 300 is $B_Z$, a bit-width of integer part including a dual code bit is $I_Z$-bit, and a bit-width of fractional part is $F_Z$-bit, then this is expressed as $[B_Z:(I_Z, F_Z)]$.

If the total bit-width of an output LLR of the MAP decoder 300 is $B_{LLR}$, a bit-width of integer part including a dual code bit is $I_{LLR}$-bit, and a bit-width of fractional part is $F_{LLR}$-bit, then this is expressed as $[B_{LLR}:(I_{LLR}, F_{LLR})]$.

Figure 4:
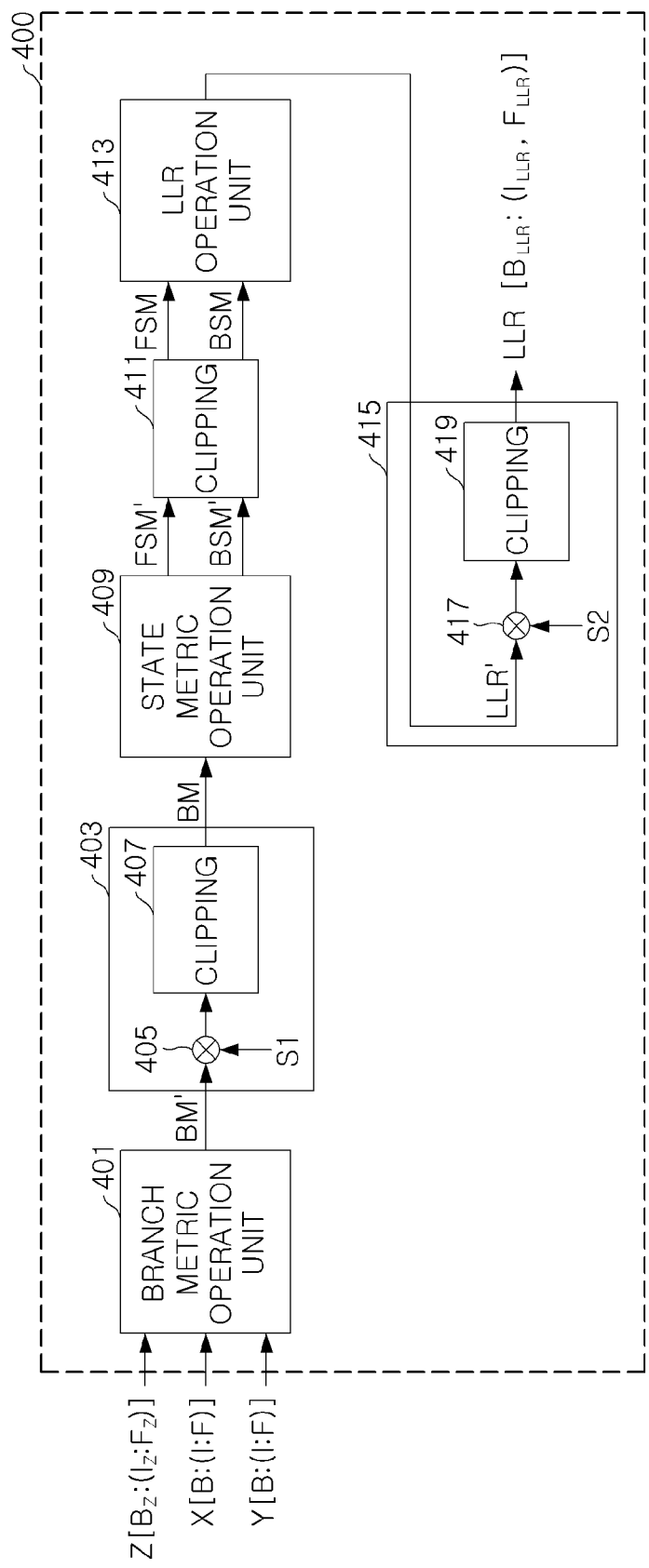
FIG. 4 is a block diagram illustrating an exemplary configuration of a MAP decoder including a bit-width controller according to an embodiment of the present invention.

FIG. 4 is a block diagram illustrating a configuration of a MAP decoder including a bit-width controller according to an embodiment of the present invention.

Referring to FIG. 4, LLR data X and Y inputted to a MAP decoder 400, which is outputted from a demodulator, have a bit-width of [B:(I, F)], data Z inputted from an interleaver or a deinterleaver has a bit-width of $[B_Z:(I_Z, F_Z)]$, and an output LLR of the MAP decoder 400 has a bit-width of $[B_{LLR}:(I_{LLR}, F_{LLR})]$.

Channel-encoded data is modulated and transmitted in a different modulation scheme such as QPSK or 16/64/256 QAM according to a channel environment. A modulation signal is inputted into a turbo decoder through a channel after undergoing demodulation by a demodulator and a soft decision.

In this case, data received from a modulator is processed in hardware. Calculated LLRs are delivered to a decoder with an identical bit-width with respect to a modulation scheme.

LLR data inputted into a MAP decoder has a bit-width including an integer part and a decimal part. In the process of calculating branch metric (BM), state metric (SM), and LLR in a decoder, the LLR value is given a different bit location of important information on data modulation.

A first bit-width control unit 403 controls a bit-width of output data BM' of a BM operation unit 401 according to a modulation scheme.

The first bit-width control unit 403 includes a first scaling unit 405, and a first clipping unit 407. The first scaling unit 405 performs data scaling by S1 according to the modulation scheme. The first clipping unit 407 again performs data clipping on the scaled data.

The data scaling is determined according to a location of important information in the calculated BM. A part where the important information is located is varied with the modulation scheme.

Data clipping performed to reduce hardware complexity means clipping data scaled in a certain bit-width.

The location of the important information is shifted upwardly or downwardly by the data scaling. The bit-width may be controlled by removing an upper part of data through the data clipping.

A SM operation unit 409 receives the BM data having a controlled bit-width, and outputs a FSM and a BSM.

In order to reduce hardware complexity, the calculated FSM and BSM may be clipped at a third clipping unit 411, or deliver to an LLR operation unit 413 as it is.

The LLR operation unit 413 outputs LLR' using the FSM and the BSM.

A bit-width of the LLR' outputted from the LLR operation unit 413 is controlled at a second bit-width control unit 415. The second bit-width control unit 415 scales and clips the LLR' by S2 through a second scaling unit 417 and a second clipping unit 419, according to the control of the bit-width of the first bit-width control unit 403.

Figure 5:
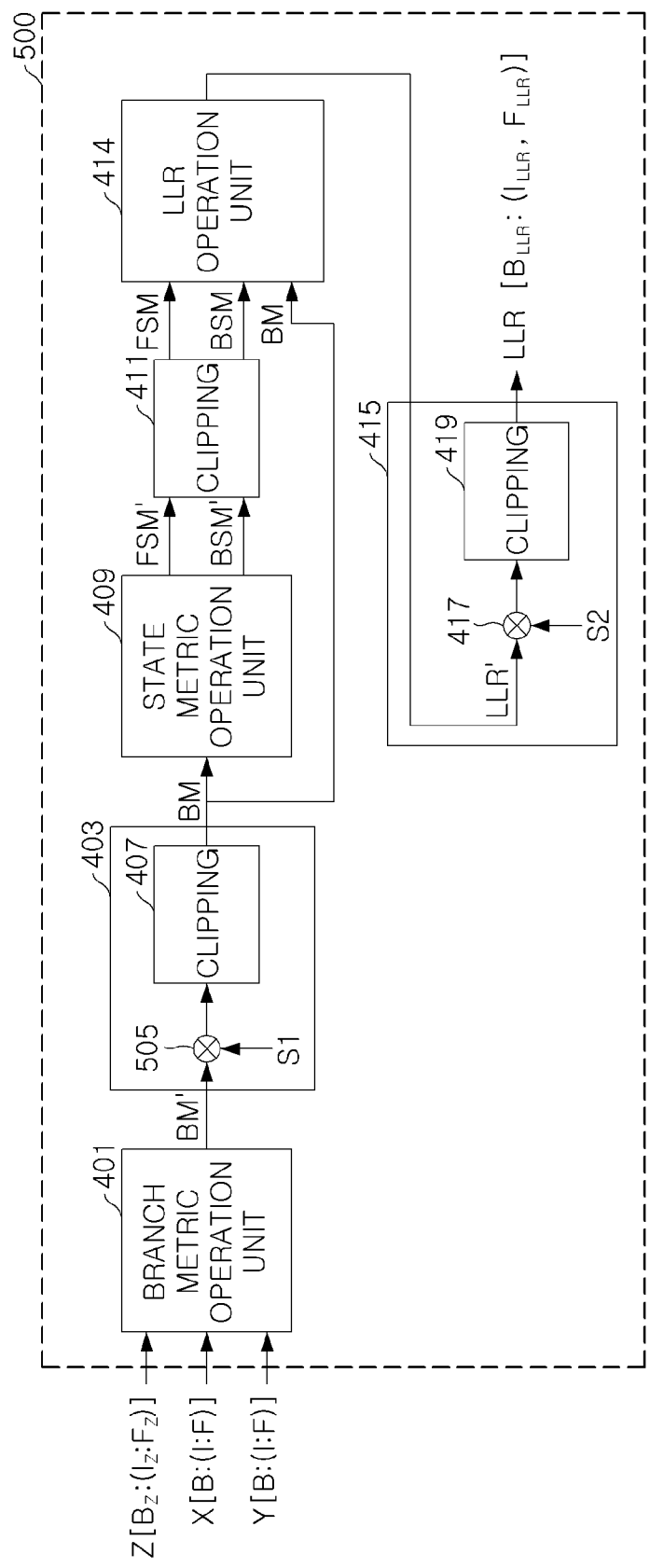
FIG. 5 is a block diagram illustrating an exemplary configuration of a MAP decoder according to another embodiment of the present invention.

FIG. 5 is a block diagram illustrating a configuration of a MAP decoder according to another embodiment of the present invention.

Referring to FIG. 5, LLR operation unit 413 may receive a FSM, a BSM, and BM data to output LLR'. The outputted LLR' is outputted as LLR through the same data scaling and data clipping as described in FIG. 4.

Scaling factors S1 and S2 can be varied with experimental performance analysis and modulation scheme. S2 may equal 1/S1 in consideration of easiness of hardware implementation.

For example, assuming that LLR inputted from a demodulator has 9 bits, clipped SM through internal operation has 9 bits, LLR finally outputted from a MAP decoder has 9 bits, and S1 and S2 have relations of S1=S2=1 for QPSK modulation signal and S1=½ and S2=2 for 16 QAM and 64 QAM modulation in regard to hardware implementation, then the amount of memory usage can be reduced, and the operation efficiency of a system can be improved.

The above descriptions referring to the accompanying drawings may be modified within the scope of the present invention.

For example, S1 and S2 satisfying a relation of S2=1/S1 are used in an exemplary embodiment, but it is not limited thereto. Accordingly, S1 and S2 may have different values according to a modulation scheme. Also, S1 and S2 have relations of S1=S2=1 for QPSK modulation signal and S1=½ and S2=2 for 16 QAM and 64 QAM in the embodiment, but not limited thereto, either. The relation of S1 and S2 may be varied with experimental performance analysis according to a system and a usage environment.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different scheme and/or replaced or supplemented by other components or their equivalents. Accordingly, other implementations are within the scope of the following claims.

What is claimed is:

1. A Maximum A Posteriori (MAP) decoder comprising:
   a first metric operation unit outputting a first metric data using an input data;
   a first bit-width control unit controlling a bit-width of the first metric data according to a modulation scheme of the input data;
   a second metric operation unit outputting a second metric data using the first metric data having the controlled bit-width;
   a Log Likelihood Ratio (LLR) operation unit outputting LLR data using the second metric data; and
   a second bit-width control unit outputting decoding data by controlling the bit-width of the LLR data.

2. The MAP decoder of claim 1, wherein the first bit-width control unit comprises:
   a first scaling unit scaling the bit-width of the first metric data by S1 according to the modulation scheme of the input data; and
   a first clipping unit clipping the scaled data at the first scaling unit, and the second bit-width control unit comprises:
   a second scaling unit scaling the bit-width of the LLR data by S2 according to the modulation scheme of the input data; and
   a second clipping unit clipping the scaled data at the second scaling unit.

3. The MAP decoder of claim 2, wherein the S1 and the S2 satisfy a relation of S2=1/S2.

4. The MAP decoder of claim 2, further comprising a third clipping unit clipping the second metric data to deliver to the LLR operation unit.

5. The MAP decoder of claim 1, wherein the LLR operation unit outputs the LLR data using the second metric data and the first metric data having the controlled bit-width.

6. The MAP decoder of claim 5, wherein the first bit-width control unit comprises:
a first scaling unit scaling the bit-width of the first metric data by S1 according to the modulation scheme of the input data; and
a first clipping unit clipping the scaled data at the first scaling unit, and the second bit-width control unit comprises:
a second scaling unit scaling the bit-width of the LLR data by S2 according to the modulation scheme of the input data; and
a second clipping unit clipping the scaled data at the second scaling unit.

7. The MAP decoder of claim 6, wherein the S1 and the S2 satisfy a relation of S2=1/S2.

8. The MAP decoder of claim 6, further comprising a third clipping unit clipping the second metric data to deliver to the LLR operation unit.

9. A MAP decoding method comprising:
outputting a first metric data using an input data;
controlling a bit-width of the first metric data according to a modulation scheme of the input data;
outputting a second metric data using the first metric data having the controlled bit-width;
outputting LLR data using the second metric data; and
controlling a bit-width of the LLR data.

10. The MAP decoding method of claim 9, wherein the controlling of a bit-width of the first metric data comprises:
scaling the bit-width of the first metric data by S1 according to the modulation scheme of the input data; and
clipping the scaled first metric data, and
the controlling of a bit-width of the LLR data comprises:
scaling the bit-width of the LLR data by S2 according to the modulation scheme of the input data; and
clipping the scaled LLR data.

11. The MAP decoding method of claim 9, wherein the S1 and the S2 satisfy a relation of S2=1/S2.

12. The MAP decoding method of claim 9, after the outputting of a second metric data, further comprising clipping the second metric data to deliver to the LLR operation unit.

13. The MAP decoding method of claim 9, wherein the outputting of LLR data comprises outputting the LLR data using the second metric data and the first metric data having the controlled bit-width.

14. The MAP decoding method of claim 13, wherein the controlling of a bit-width of the first metric data comprises:
scaling the bit-width of the first metric data by S1 according to the modulation scheme of the input data; and
clipping the scaled first metric data, and
the controlling of a bit-width of the LLR data comprises:
scaling the bit-width of the LLR data by S2 according to the modulation scheme of the input data; and
clipping the scaled LLR data.

15. The MAP decoding method of claim 13, wherein the S1 and the S2 satisfy a relation of S2=1/S2.

16. The MAP decoding method of claim 13, after the outputting of a second metric data, further comprising clipping the second metric data to deliver to the LLR operation unit.

17. A turbo decoder comprising:
a first MAP decoder outputting a first LLR using a deinterleaved LLR and a first input data from a demodulator;
an interleaver interleaving data acquired by subtracting the deinterleaved LLR from the first LLR;
a second MAP decoder outputting a second LLR using a second input data received from the demodulator and the interleaved data; and
a first deinterleaver deinterleaving data acquired by subtracting the data outputted from the interleaver from the second LLR to transmit to the first MAP decoder,
wherein each of the first and the second MAP decoders comprise:
a first metric operation unit outputting a first metric data using the input data;
a first bit-width control unit controlling a bit-width of the first metric data according to a modulation scheme of the input data;
a second metric operation unit outputting a second metric data using the first metric data having the controlled bit-width;
an LLR operation unit outputting LLR data using the second metric data; and
a second bit-width control unit outputting decoding data by controlling the bit-width of the LLR data.

18. The turbo decoder of claim 17, wherein each of the first and the second MAP decoder further comprises a third clipping unit clipping the second metric data to deliver to the LLR operation unit.

19. The turbo decoder of claim 17, wherein the LLR operation unit outputs the LLR data using the second metric data and the first metric data having the controlled bit-width.

20. The turbo decoder of claim 19, wherein each of the first and the second MAP decoder further comprises a third clipping unit clipping the second metric data to deliver to the LLR operation unit.

* * * * *